(12) United States Patent
Cadieux et al.

(10) Patent No.: US 7,855,130 B2
(45) Date of Patent: Dec. 21, 2010

(54) CORROSION INHIBITOR ADDITIVES TO PREVENT SEMICONDUCTOR DEVICE BOND-PAD CORROSION DURING WAFER DICING OPERATIONS

(75) Inventors: Robert R Cadieux, St. Albans, VT (US); Scott A Estes, Essex Junction, VT (US); Timothy C Krywanczyk, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1844 days.

(21) Appl. No.: 10/249,576

(22) Filed: Apr. 21, 2003

(65) Prior Publication Data
US 2004/0209443 A1    Oct. 21, 2004

(51) Int. Cl.
*H01L 21/78* (2006.01)
*H01L 21/46* (2006.01)

(52) U.S. Cl. ............... 438/460; 438/113; 257/E21.599

(58) Field of Classification Search ......... 438/460, 438/113; 83/15, 22
See application file for complete search history.

(56) References Cited

U.S. PATENT DOCUMENTS

| | | | | |
|---|---|---|---|---|
| 5,156,769 | A | * | 10/1992 | Cha et al. .......... 252/395 |
| 5,461,008 | A | * | 10/1995 | Sutherland et al. ...... 83/15 |
| 6,447,563 | B1 | * | 9/2002 | Mahulikar ........... 51/309 |
| 2002/0081776 | A1 | | 6/2002 | Tellkamp ............ 438/113 |

* cited by examiner

*Primary Examiner*—Alexander G Ghyka
(74) *Attorney, Agent, or Firm*—Richard M. Kotulak

(57) ABSTRACT

An improved method of dicing a semiconductor wafer which substantially reduces or eliminates corrosion of copper-containing, aluminum bonding pads. The method involves continuously contacting the bonding pads with deionized water and an effective amount of a copper corrosion inhibiting agent, most preferably benzotriazole. Also disclosed, is an improved apparatus for dicing a wafer, in which a copper corrosion inhibiting agent is included in the cooling system for cooling the dicing blade.

12 Claims, 3 Drawing Sheets

CORROSION INHIBITOR ADDITIVES TO PREVENT SEMICONDUCTOR DEVICE BOND-PAD CORROSION DURING WAFER DICING OPERATIONS

BACKGROUND OF INVENTION

1. Technical Field

The present invention relates generally to corrosion inhibition for semiconductor devices. More particularly, the present invention relates to an improved method of dicing semiconductor wafers which reduces corrosion of bonding pads.

2. Related Art

It is common in the semiconductor industry to employ aluminum to interconnect structures on integrated circuits and to form the input/output bonding pads. To improve electromigration characteristics and other properties, additives such as copper, e.g. up to 2 percent by weight, or silicon, e.g. up to 1 percent by weight, are typically incorporated into the aluminum conductors. Combinations of aluminum with several of these additives are also known in the art.

After forming the integrated circuits on a wafer, dicing or sawing of the wafer is carried out to provide chips by use of a computer-controlled dicing blade. Because the bonding pads are exposed during dicing operations, they are susceptible to corrosion. One approach to reducing corrosion during dicing, involves the use of high purity deionized water as a coolant for the dicing blade. However, this can lead to a build up of static charge, resulting in accumulation of silicon particles on the bonding pads, as well as contributing to corrosion.

In an effort to address these problems, U.S. Pub. No. US2002/0081776A1 describes affixing a sacrificial anode contacting magnesium to the dicing blade.

Another proposed technique for reducing adherence of silicon particles to bonding pads is described in U.S. Pat. No. 5,461,008, in which the pH of the deionized water is lowered to less than 5.5.

However, there still exists a need in the industry for an improved method for reducing the corrosion of bonding pads on a wafer during dicing, and an improved dicing apparatus for use in practicing the method.

SUMMARY OF INVENTION

It is against this background, that the present invention introduces an improved method for reducing corrosion of integrated circuit bonding pads during wafer dicing. In general, it has been found that this can be achieved by contacting the bonding pads with deionized water and a copper corrosion inhibiting amount of a copper corrosion inhibiting agent. It has been found that an improvement occurs by reducing or even eliminating bond pad darkening due to excessive oxide growth or by reducing or even eliminating pitting of bonding pads due to direct dissolution of localized regions of the bonding pad. Although a variety of mechanisms are believed to be responsible for producing this result, they generally involve a modification of the kinetics of oxidation or dissolution at the corroding surface or at a surface electrically connected to and cathodic with respect to the corroding surface. In accordance with the invention, the contacting is carried out continuously during the dicing operation, and preferably during cooling of the dicing apparatus.

The present invention also provides an improved dicing apparatus, which reduces corrosion of integrated circuit bonding pads on the wafer. In accordance with this aspect of the invention, deionized water and a copper corrosion inhibiting amount of a copper corrosion inhibiting agent are included in the cooling system for cooling the dicing blade of the apparatus.

An advantage that can be achieved by employing the improved method or improved apparatus of the invention is reduced product scrap, and hence reduced costs associated with scrapping product at such a late point in fabrication, i.e. in dicing operations.

The foregoing and other features and advantages will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
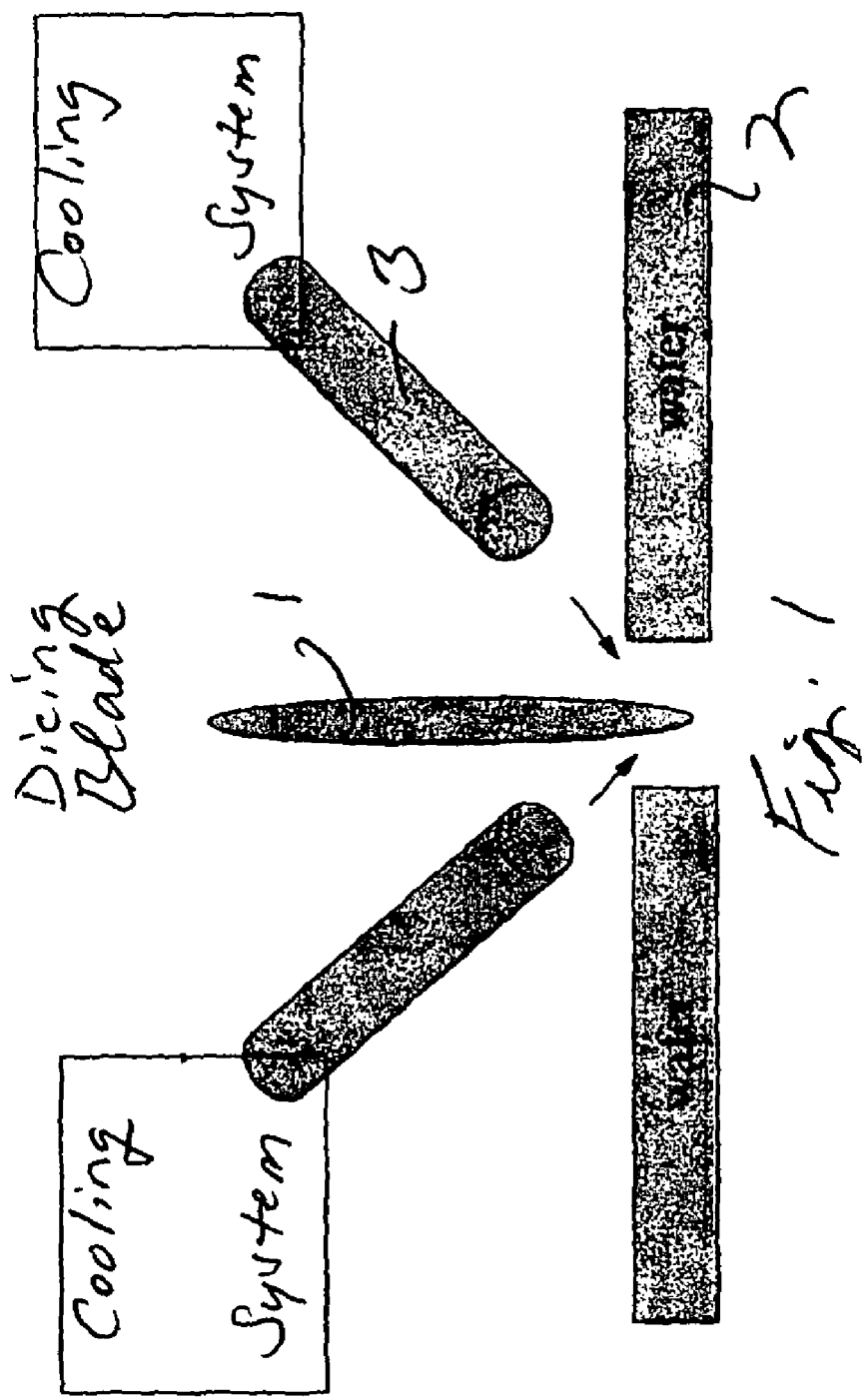
FIG. 1 is a schematic section view of a dicing blade that can be used in the practice of the invention.

FIG. 1 illustrates a dicing operation, in which a dicing blade or saw 1 has engaged a semiconductor wafer 2. Typically, the dicing blade 1 is mounted to a rotatable shaft, which in turn is connected to a motor (not shown). The details of a conventional dicing apparatus are known to those skilled in the art, and a more detailed description can be found, for example, in U.S. Pat. No. 5,461,008 or U.S. Pub. No. US2002/0081776 A1, the descriptions of both of which are incorporated herein by reference. FIG. 1 also illustrates a cooling system 3 for delivering high purity or deionized water to the dicing blade 1 and the surface of the wafer 2. The cooling system 3 is employed to cool the dicing blade 1 and the wafer 2 during a dicing operation. As also known, the wafer 2 contains numerous integrated circuit patterns, which have been defined in a predetermined manner. During dicing, the wafer 2 is cut or diced into individual chips. The integrated circuit pattern are covered with a protective coating, except at portions where bonding pads are located.

Figure 2:
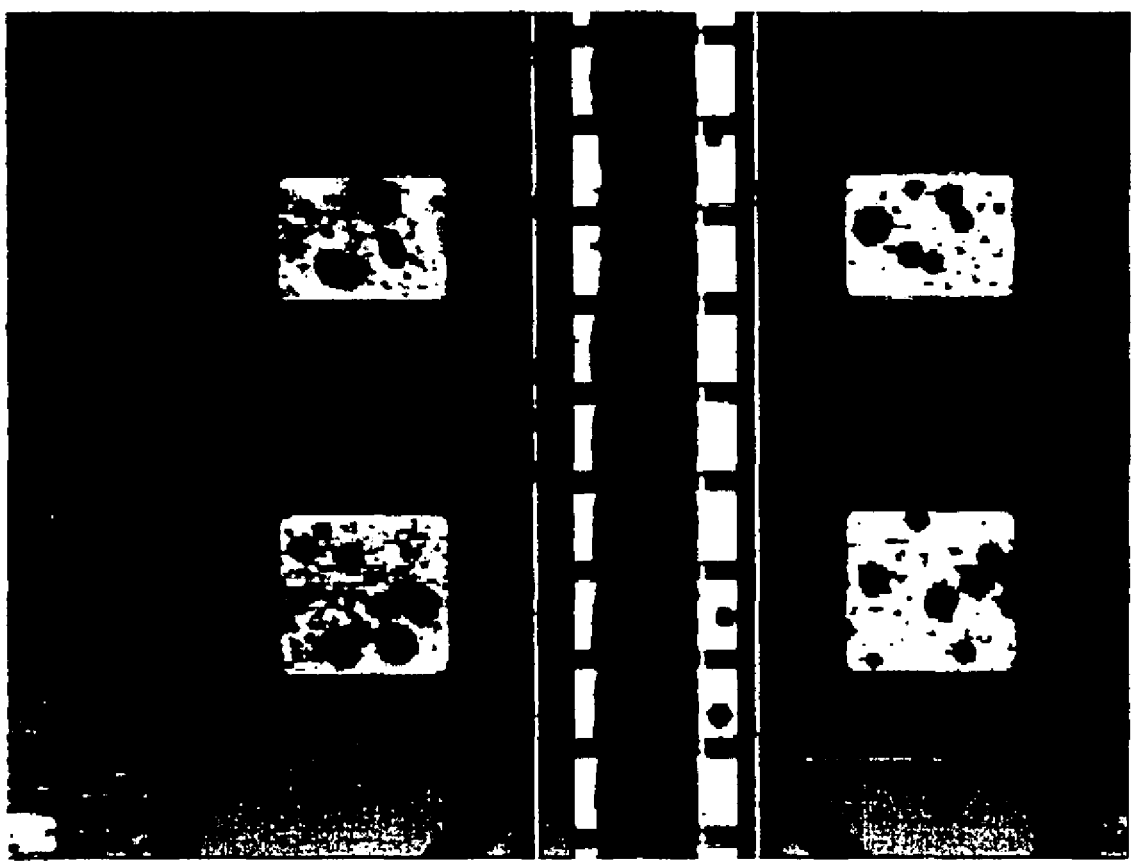
FIG. 2 is an SEM micrograph showing corrosion of a bonding pad, typically encountered in the prior art.

The bonding pads are usually aluminum, containing copper which is less than about 2 percent, preferably less than about 1 percent, and more preferably less than about 0.5 percent, by weight. In addition, the aluminum may contain other additives, such as, for example, silicon. Due to the presence of copper, it has been found that corrosion of the copper may occur, leading to corrosion of the bonding pads, as shown in FIG. 2.

Figure 3:
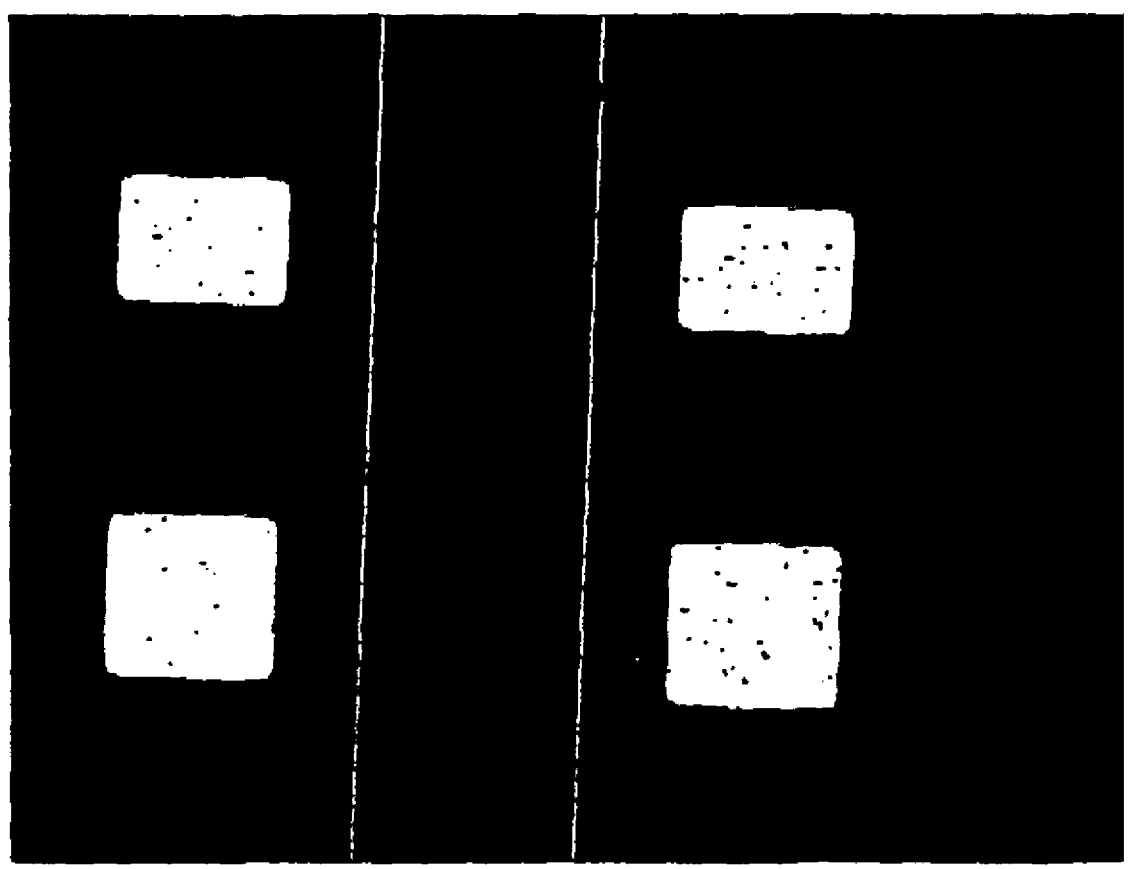
FIG. 3 is an SEM micrograph showing a corrosion-free bonding pad, resulting from the practice of the present invention.

In accordance with the invention, corrosion of the bonding pads is substantially reduced or eliminated by contacting the bonding pads with an effective amount of a copper corrosion inhibiting agent. Preferably, the contacting is carried out continuously during the dicing operation. It is also preferred that the copper corrosion inhibiting agent be added to the cooling system, for example, by admixture with deionized water delivered to the cooling blade 1 and the surface of the wafer 2. In carrying out the invention, minimal or no residuals occur on the wafer surface, and copper is effectively passivated at the grain boundaries of the aluminum. As a result of corrosion prevention, black stains are not visible as shown in FIG. 3. As a particular advantage of the invention, no additional treatment or processing step is required, due to avoidance of residue on the bonding pads.

Suitable copper corrosion inhibiting agents include alkyl or alkoxy benzotriazole, mercaptobenzothiazole, alkyl or alkoxy mercaptobenzothiazole and ammonium or alkali metal salts thereof, tolyltriazole, benzotriazole, a substituted benzotriazole and/or 1-phenyl-5-mercaptotetrazole, etc.

Other suitable copper corrosion inhibiting agents include polyphosphates (acid form, or ammonium or alkali metal salt). The polyphosphates can include but are not limited to the following compounds: Methyl diphosphonic acid, aminotris (methylene phosphonic acid), ethylidene diphosphonic acid, 1-hydroxyethylidene-1,1-diphosphonic acid, 1-hydroxypropylidene-1,1-diphosphonic acid, ethyl aminobis (methylene phosphonic acid), dodecylaminobis (methylene phosphonic acid), nitrylotris (methylene phosphonic acid) or nitrilotris (methylene) triphosphonic acid, ethylenediaminebis (methylene phosphonic acid), ethylenediamine-tetrakis (methylene phosphonic acid), hexenediamine-tetrakis (methylene phosphonic acid), diethylene-triaminepenta (methylene phosphonic acid), ammonium salts thereof, lithium salts thereof, sodium salts thereof, potassium salts thereof, rubidium salts thereof, cesium salts thereof (i.e. ammonium and alkali salts thereof), and so forth.

Additionally, suitable copper corrosion inhibiting agents include organic carboxylic acids and organic polycarboxylic acids (ammonium and alkali salts thereof). For example, such organic acids can include but are not limited to the following compounds: Citric acid, succinic acid, glutaric acid, adipic acid, malic acid, malonic acid, oxalic acid, fumaric acid, polytartaric acid compounds having the generalized formula

HO—(CRCOOHCRCOOHO)$_n$-H wherein each R is independently selected from the group consisting of H and C1 to C4 alkyl, n is less than 4 and the average molecular weight of the mixture corresponds to an average n in the range 1.2 to 3, erythrarictartaric acid, polytartaric acid, L-tartaric acid, mucic acid and ammonium salts thereof, lithium salts thereof, sodium salts thereof, potassium salts thereof, rubidium salts thereof, cesium salts thereof (i.e. ammonium and alkali salts thereof), and so forth.

Further examples of suitable copper corrosion inhibiting agents, include chelation compounds, and acid forms or ammonium and alkali salts thereof. Such chelation compounds can include but are not limited to the following compounds: CDTA, trans-1,2-Diaminocyclohexane-N,N,N,N-tetraacetic acid (or a mixture of the trans and cis isomers), EDTA (ethylenediaminetetraacetic acid) and ammonium salts thereof, lithium salts thereof, sodium salts thereof, potassium salts thereof, rubidium salts thereof, cesium salts thereof (i.e. ammonium and alkali salts thereof), and so forth.

In addition, it should be understood, of course, that mixtures of suitable copper corrosion inhibiting agents can also be employed in accordance with the present invention.

Further, as noted above, it is preferred that the copper corrosion inhibiting agent be added to the cooling system, but this can be accomplished in any suitable manner, such as mixing with the deionized water in the supply line, addition to the reservoir of deionized water, etc. While many of the copper corrosion inhibiting agents can be satisfactorily added to the deionized water, it may be preferred, particularly if the copper corrosion inhibiting agent is not soluble in water, to first add it to a solvent which is miscible with water, such as an alcohol, e.g. isopropanol, then dissolve in a suitable volume of water. The resulting solution can then be added to the deionized water of the cooling system.

The amount of copper corrosion inhibiting agent that is employed can vary over a wide range, depending generally upon the exact copper corrosion inhibiting agent or mixture of agents selected, as well as the proportion of copper in the bonding pads of the integrated circuits and other features of the wafer being diced. However, an amount ranging from about 0.01 to about 200 mmoles per liter would be typical, with a preferred amount ranging from about 0.1 to about 20 mmoles per liter. In a particularly preferred embodiment of the invention, the copper corrosion inhibiting agent is benzotriazole, used in an amount ranging from about 1 to about 10 mmoles per liter. Preferably, the bonding pads are contacted with deionized water and a copper corrosion inhibiting agent for a period of time ranging from about 0.3 to about 4.5 hours, depending upon the characteristics of the wafer being diced, particularly the composition of the bonding pads.

Accordingly, the embodiments of the invention as set forth above are intended to be illustrative, not limiting. Various changes may be made without departing from the spirit and scope of the invention as defined in the following claims.

The invention claimed is:

1. A method, comprising:
    dicing a semiconductor wafer into individual integrated circuit chips, said integrated chips including integrated circuit patterns and bonding pads, and a protective coating over said integrated circuit patterns but not over said bonding pads;
    while performing said dicing, contacting said bonding pads with deionized water and a copper corrosion inhibiting amount of a copper corrosion inhibiting agent, said deionized water cooling a dicing blade performing said dicing and cooling said semiconductor wafer;
    wherein said bonding pads comprise aluminum and an amount of copper which is less than about 2 percent by weight; wherein said copper corrosion inhibiting agent is selected from a benzotriazole and a polyphosphate; and
    wherein said contacting is carried out continuously during said dicing of said semiconductor wafer.

2. The method of claim 1, wherein said copper corrosion inhibiting amount ranges from about 0.1 to about 20 mmoles per liter.

3. The method of claim 1, wherein said copper corrosion inhibiting agent consists of a benzotriazole.

4. The method of claim 1, wherein said bonding pads comprise aluminum and an amount of copper which is less than about 1 percent by weight.

5. The method of claim 1, wherein said bonding pads comprise aluminum and less than about 0.5 percent copper.

6. The method of claim 1, wherein said copper corrosion inhibiting agent consists of a compound selected from the group consisting of alkyl or alkoxy benzotriazole, mercaptobenzothiazole, alkyl or alkoxy mercaptobenzothiazole and ammonium or alkali metal salts thereof, tolyltriazole, benzotriazole, a substituted benzotriazole and 1-phenyl-5-mercaptotetrazole.

7. The method of claim 1, including:
    mixing said copper corrosion inhibiting agent with a solvent to form a copper corrosion inhibiting solution;
    mixing said copper corrosion inhibiting solution with said deionized water in a supply line; and
    contacting said bonding pads with the output of said supply line while performing said dicing.

8. The method of claim 1, including:
mixing said copper corrosion inhibiting agent with a solvent to form a copper corrosion inhibiting solution;
adding said copper corrosion inhibiting solution to a reservoir of deionized water to form a corrosion inhibiting cooling solution; and
contacting said bonding pads with said corrosion inhibiting solution while performing said dicing.

9. The method of claim 1, wherein said corrosion inhibiting agent consists of a polyphosphate.

10. The method of claim 1, wherein said bonding pads include silicon.

11. The method of claim 1, wherein said copper corrosion inhibiting agent passivates copper at the grain boundaries of the aluminum.

12. The method of claim 1, wherein said copper corrosion inhibiting agent is selected from the group consisting of alkyl or alkoxy benzotriazole, mercaptobenzothiazole, alkyl or alkoxy mercaptobenzothiazole and ammonium or alkali metal salts thereof, tolyltriazole, benzotriazole, a substituted benzotriazole and 1-phenyl-5-mercaptotetrazole.

* * * * *